US010751920B2

(12) United States Patent
Sato

(10) Patent No.: US 10,751,920 B2
(45) Date of Patent: Aug. 25, 2020

(54) IMPRINT APPARATUS AND METHOD FOR PRODUCING ARTICLE

(71) Applicant: CANON KABUSHIKI KAISHA, Tokyo (JP)

(72) Inventor: Hiroshi Sato, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 455 days.

(21) Appl. No.: 15/360,307

(22) Filed: Nov. 23, 2016

(65) Prior Publication Data

US 2017/0151694 A1    Jun. 1, 2017

(30) Foreign Application Priority Data

Nov. 30, 2015  (JP) ................................. 2015-233756

(51) Int. Cl.
*B29C 43/58* (2006.01)
*G03F 7/00* (2006.01)
(Continued)

(52) U.S. Cl.
CPC ............ *B29C 43/58* (2013.01); *B29C 43/021* (2013.01); *G03F 7/0002* (2013.01); *G03F 9/7042* (2013.01); *B29C 2043/025* (2013.01); *B29C 2043/3602* (2013.01); *B29C 2043/585* (2013.01); *B29C 2043/5833* (2013.01); *G03F 7/7085* (2013.01); *G03F 9/7069* (2013.01); *G03F 9/7073* (2013.01); *G03F 9/7076* (2013.01); *G03F 9/7084* (2013.01); *G03F 9/7088* (2013.01)

(58) Field of Classification Search
CPC .............. B29C 43/58; B29C 2043/025; B29C 2043/3602; B29C 2043/5833; B29C 2043/585; G03F 7/7085; G03F 9/7042; G03F 9/7069; G03F 9/7073; G03F 9/7076; G03F 9/7084; G03F 9/7088
USPC ........................................ 264/293; 425/385
See application file for complete search history.

(56) References Cited

U.S. PATENT DOCUMENTS

2011/0013165 A1    1/2011  Kaneko
2011/0147970 A1    6/2011  Sato
(Continued)

FOREIGN PATENT DOCUMENTS

CN        104122746 A        10/2014
CN        104160477 A        11/2014
(Continued)

*Primary Examiner* — Joseph S Del Sole
*Assistant Examiner* — Lawrence D. Hohenbrink, Jr.
(74) *Attorney, Agent, or Firm* — Canon U.S.A., Inc. I.P. Division

(57) ABSTRACT

An imprint apparatus for forming a pattern of an imprint material on a substrate using a mold includes a plurality of alignment scopes and a control unit. The control unit controls aligning of a shot region of the substrate and the mold based on outputs from the plurality of alignment scopes. Each of the plurality of alignment scopes outputs information indicating a relative position of a first mark selected from a plurality of first marks in the shot region and a second mark selected from a plurality of second marks on the mold. The control unit controls aligning of the shot region and the mold based on information excluding incorrect information from a plurality of pieces of information output from the plurality of alignment scopes.

21 Claims, 9 Drawing Sheets

(51) Int. Cl.
*G03F 9/00* (2006.01)
*B29C 43/02* (2006.01)
*B29C 43/36* (2006.01)
*G03F 7/20* (2006.01)

(56) References Cited

U.S. PATENT DOCUMENTS

| | | |
|---|---|---|
| 2011/0198769 A1 | 8/2011 | Maeda |
| 2012/0286443 A1* | 11/2012 | Sato ........................ G01B 11/27 |
| | | 264/40.5 |
| 2014/0300016 A1 | 10/2014 | Sato |
| 2015/0049317 A1 | 2/2015 | Mishima |

FOREIGN PATENT DOCUMENTS

| | | |
|---|---|---|
| CN | 104181768 A | 12/2014 |
| JP | 11-097510 A | 4/1999 |
| JP | 2001-217180 A | 8/2001 |
| JP | 2007-115740 A | 5/2007 |
| JP | 2007-281072 A | 10/2007 |
| JP | 4185941 A | 11/2008 |
| JP | 2011-127979 A | 6/2011 |
| JP | 2011-258922 A | 12/2011 |
| JP | 2012-084732 A | 4/2012 |
| JP | 2012-253325 A | 12/2012 |
| JP | 2013-197107 A | 9/2013 |
| JP | 2014-203935 A | 10/2014 |
| JP | 2015-037122 A | 2/2015 |
| TW | 2014-41061 A | 11/2014 |
| WO | 2013136730 A1 | 9/2013 |

* cited by examiner

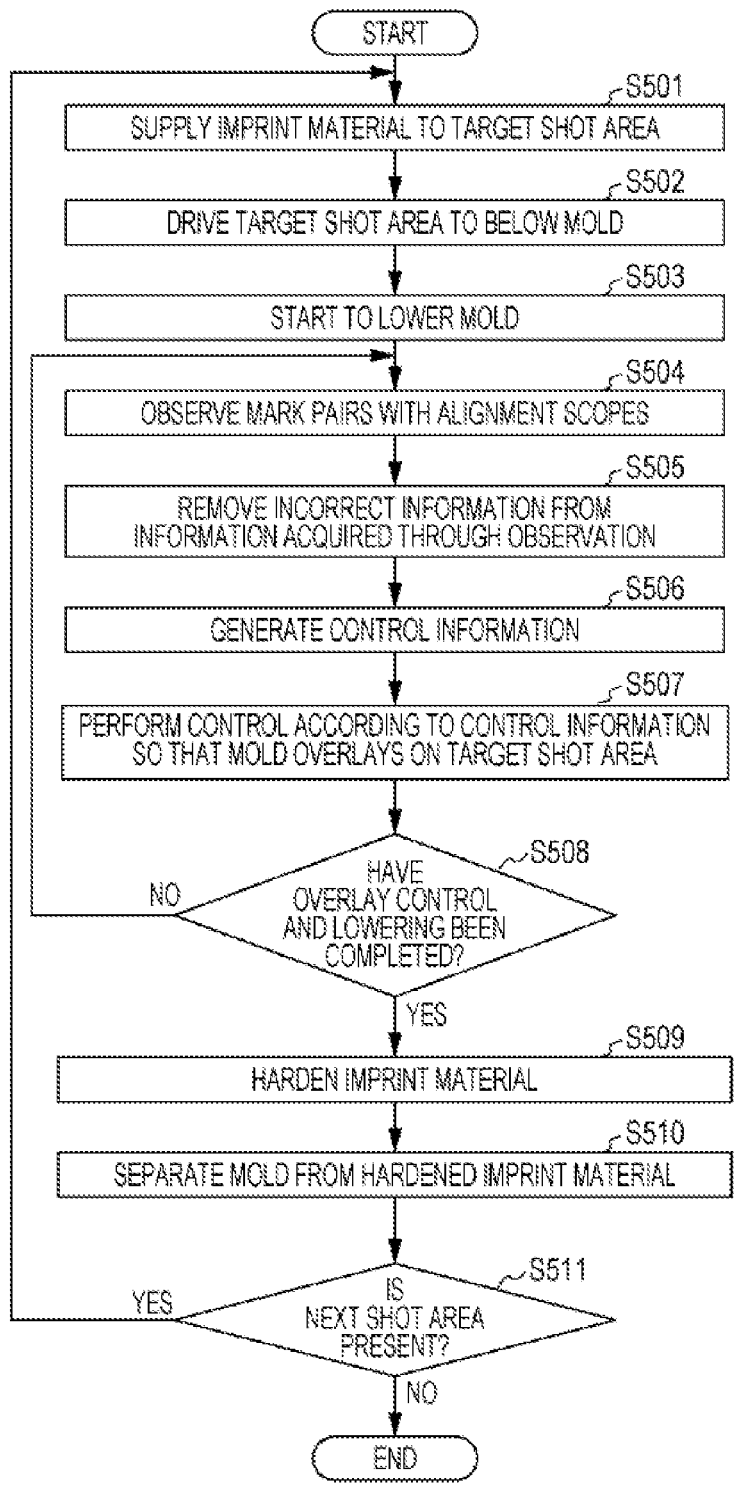

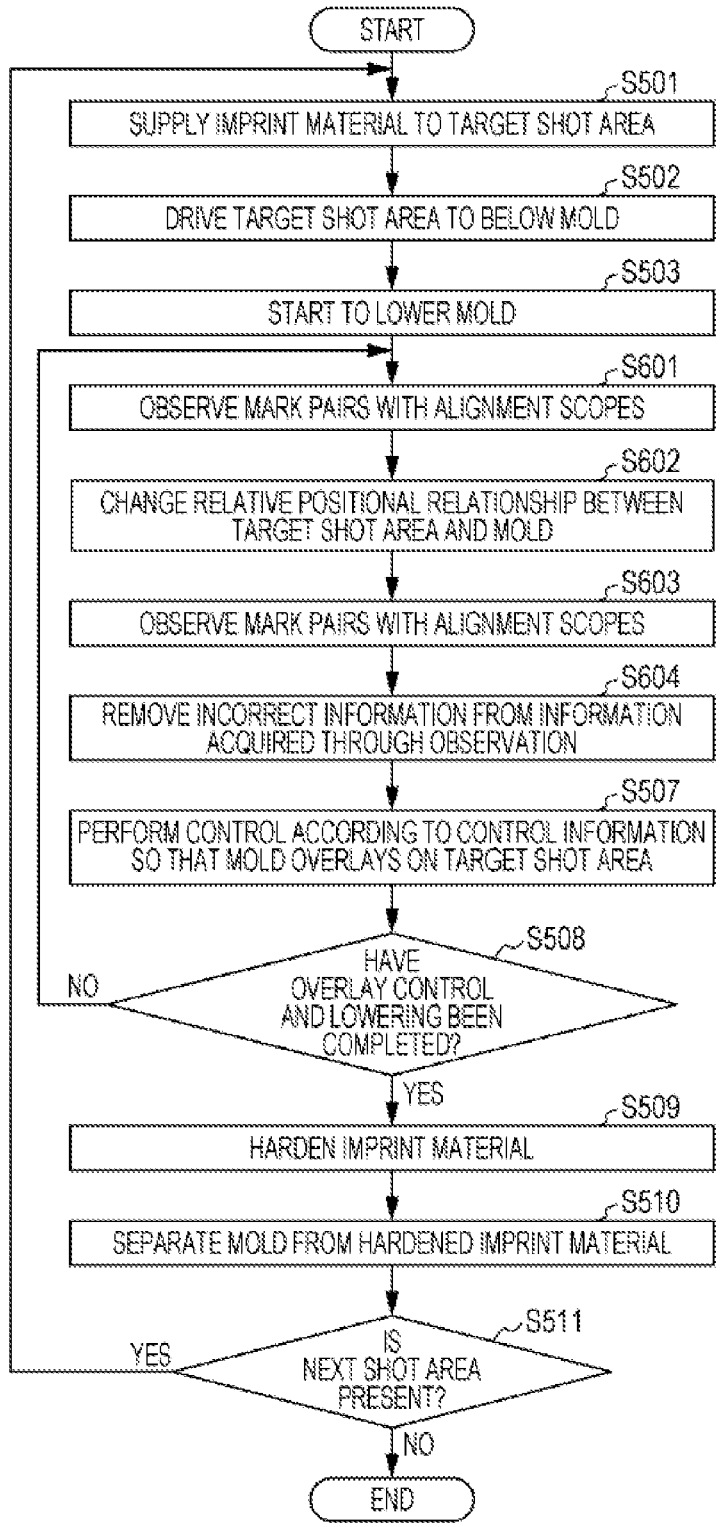

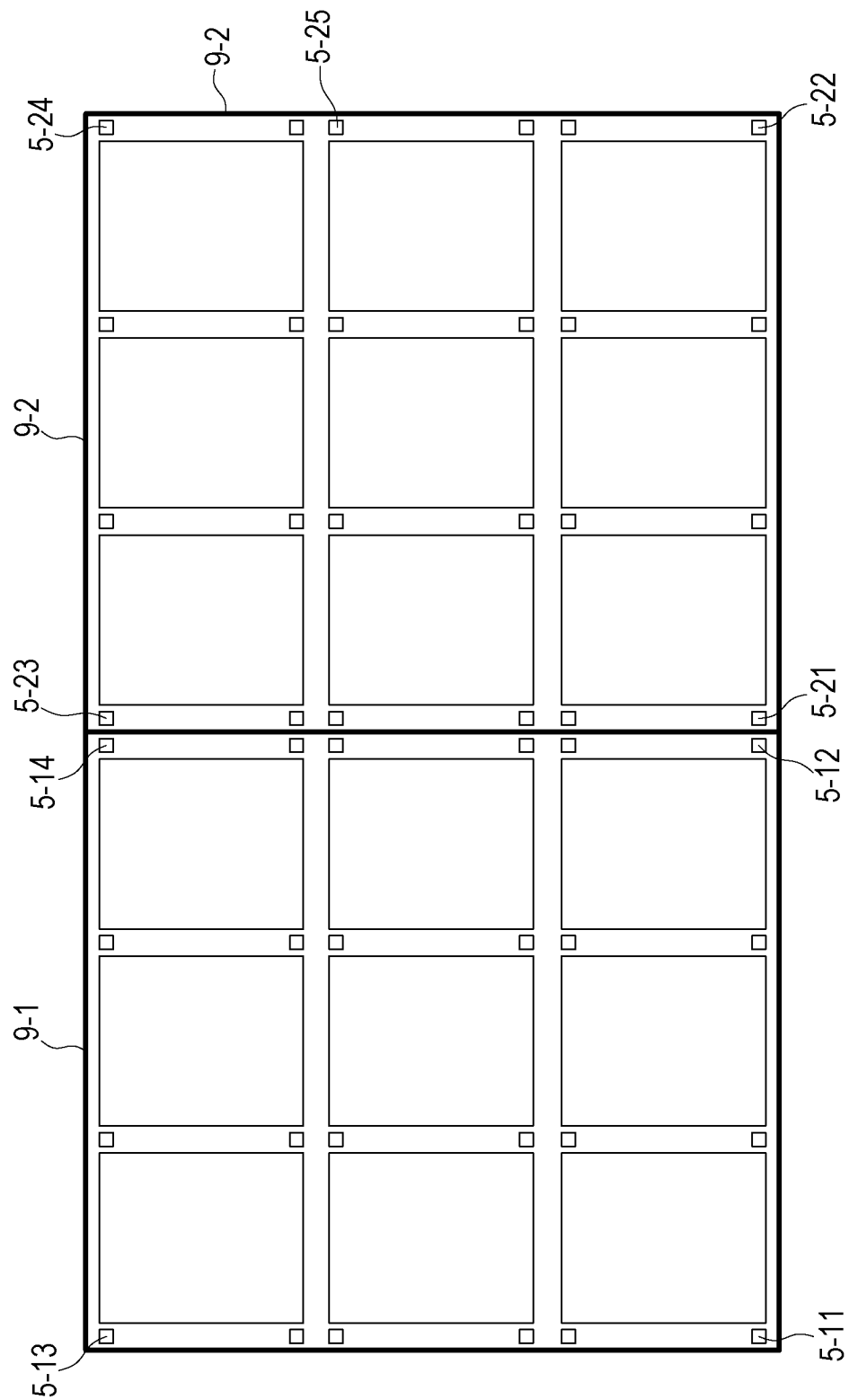

IMPRINT APPARATUS AND METHOD FOR PRODUCING ARTICLE

BACKGROUND OF THE INVENTION

Field of the Invention

The present disclosure relates to an imprint apparatus and a method for producing an article.

Description of the Related Art

Imprint apparatuses for forming a pattern using a mold are drawing attention. Imprint apparatuses bring a mold into contact with an imprint material supplied onto a substrate and harden the imprint material in that state. In forming an additional layer on a substrate on which a shot area is defined using an imprint apparatus, it is necessary to align the mold with the shot area of the substrate. The alignment can be performed by detecting a relative position of a mark formed on the substrate to indicate the position of the shot area to a mark formed on the mold to indicate the position of the mold using an alignment scope. In general, a plurality of marks are formed in one shot area, and a plurality of marks are formed also on the mold. One of the marks in the shot area and one of the marks on the mold constitute a mark pair, and the relative position between the mark in the shot area and the mark on the mold is detected for each mark pair.

To effectively detect relative positions of a plurality of mark pairs, an imprint apparatus can include a plurality of alignment scopes. Japanese Patent No. 4185941 discloses an imprint apparatus including a plurality of alignment scopes.

Information, such as image signals, output from alignment scopes can contain various pieces of incorrect information. For example, marks in a shot area can have deformation and uneven thickness caused by processing, which can generate incorrect information. Also, when foreign particles adhere to the substrate or the mold, incorrect information can be generated. Even if incorrect information is contained in a plurality of pieces of information on a plurality of mark pairs for alignment of a shot area and a mold, output from alignment scopes, conventional imprint apparatuses have not performed a process for not using the incorrect information. Accordingly, alignment of a shot area and a mold can be controlled based on incorrect alignment information affected by incorrect relative position detected based on incorrect information. This can result in low accuracy in aligning the shot area and the mold.

SUMMARY OF THE INVENTION

An imprint apparatus, according to an aspect of the present disclosure, for forming a pattern of an imprint material on a substrate using a mold includes a plurality of alignment scopes, and a control unit that controls aligning of a shot region of the substrate and the mold based on outputs from the plurality of alignment scopes, wherein each of the plurality of alignment scopes outputs information indicating a relative position of a first mark selected from a plurality of first marks in the shot region and a second mark selected from a plurality of second marks on the mold, and wherein the control unit controls aligning of the shot region and the mold based on information excluding incorrect information from a plurality of pieces of information output from the plurality of alignment scopes.

Further features of the present invention will become apparent from the following description of exemplary embodiments with reference to the attached drawings.

BRIEF DESCRIPTION OF THE DRAWINGS

FIG. 5 is a flowchart for an imprinting operation according to an embodiment of the present disclosure.

FIG. 6 is a flowchart for an imprinting operation according to a modification.

FIG. 9 is a diagram illustrating two shot areas.

DESCRIPTION OF THE EMBODIMENTS

Embodiments of the present disclosure will be described hereinbelow with reference to the accompanying drawings.

Figure 1A:
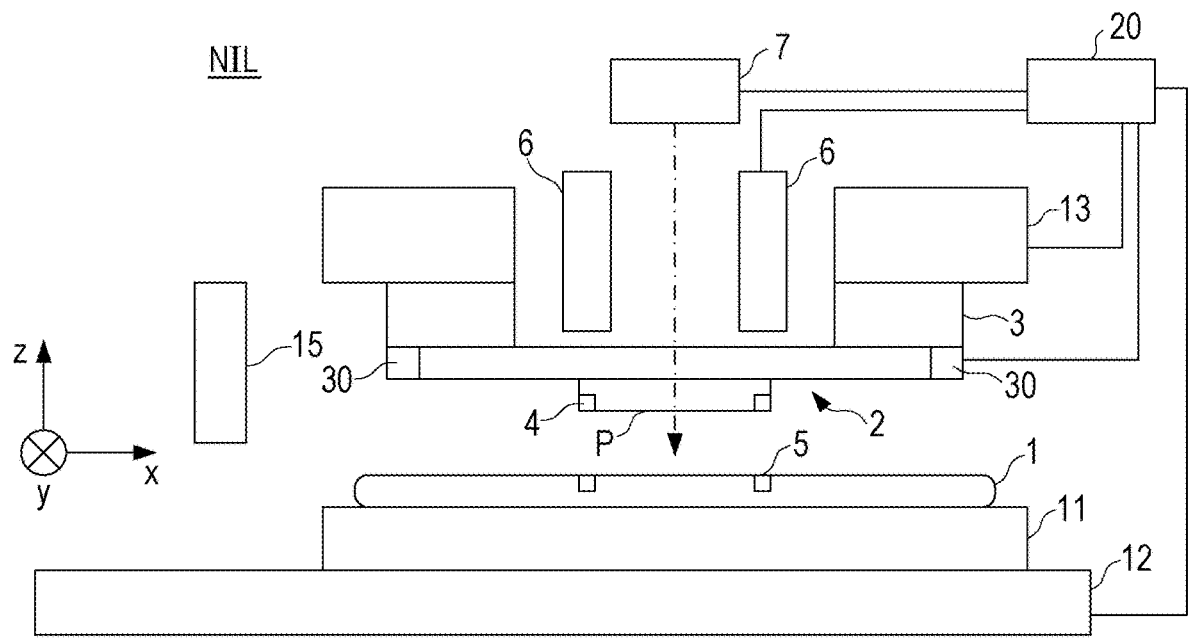
FIG. 1A is a diagram schematically illustrating the configuration of an imprint apparatus according to an embodiment of the present disclosure.
Figure 1B:
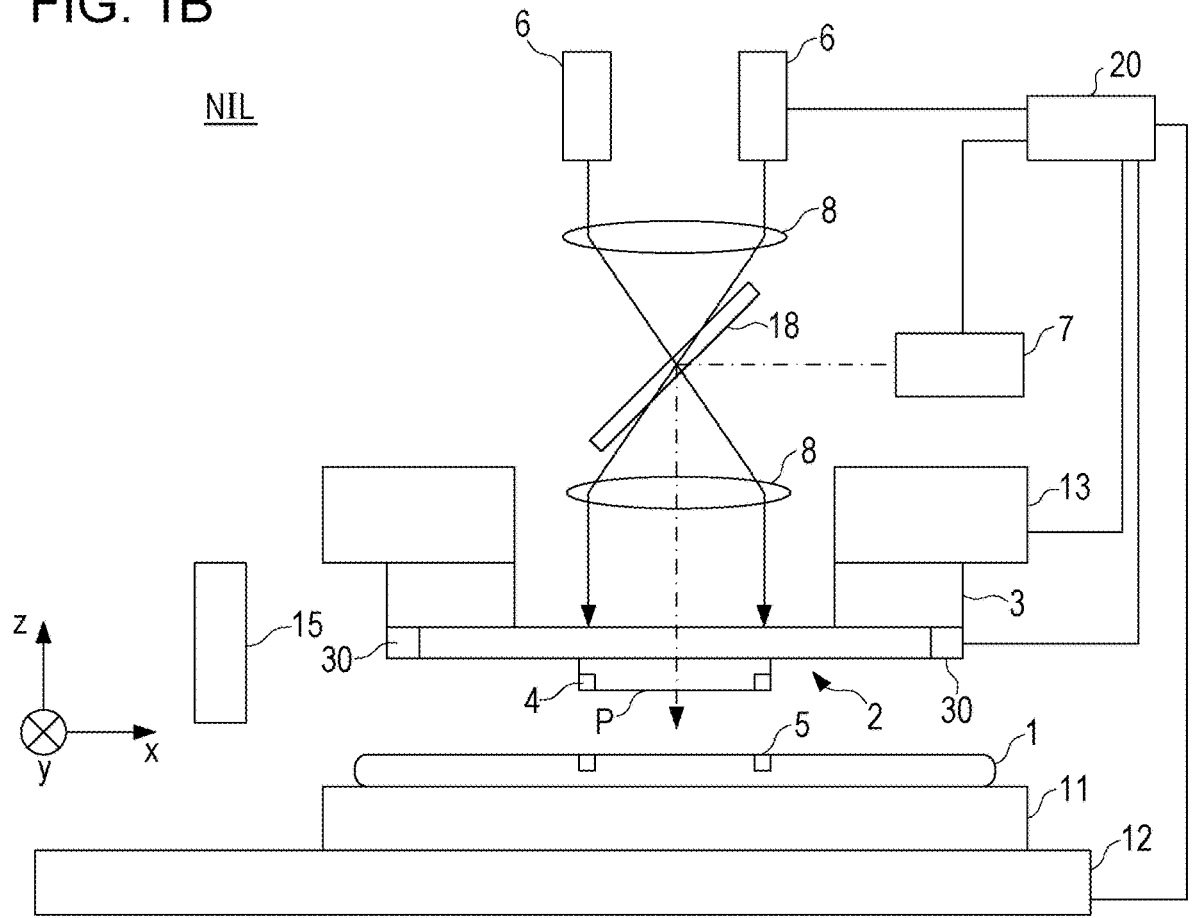
FIG. 1B is a diagram schematically illustrating the configuration of an imprint apparatus according to another embodiment of the present disclosure.

FIG. 1A schematically illustrates the configuration of an imprint apparatus NIL (nanoimprint lithography) according to an embodiment of the present disclosure. FIG. 1B schematically illustrates the configuration of an imprint apparatus NIL according to another embodiment of the present disclosure. The imprint apparatus NIL in FIG. 1A and the imprint apparatus NIL in FIG. 1B differ in the disposition of a hardening unit 7 for hardening the imprint material and alignment scopes 6.

The imprint apparatus NIL is configured to bring a mold 2 (specifically, a patterned portion P of the mold 2) into contact with an imprint material on a substrate 1 and harden the imprint material to form a pattern of the imprint material. In this specification and the accompanying drawings, directions are indicated in the XYZ coordinate system in which a plane parallel to the surface of the processing target substrate 1 is an X-Y plane. Directions parallel to an X-axis, a Y-axis, and a Z-axis in the XYZ coordinate system are respectively referred to as X-direction, Y-direction, and Z-direction, and rotation about the X-axis, rotation about the Y-axis, and rotation about the Z-axis are respectively referred to as θX, θY, and θZ. Control or driving about the X-axis, Y-axis, and Z-axis is respectively control or driving about a direction parallel to the X-axis, a direction parallel to the Y-axis, and a direction parallel to the Z-axis. Control or driving about the θX-axis, θY-axis, and θZ-axis is respectively control or driving about rotation about an axis parallel to the X-axis, rotation about an axis parallel to the Y-axis, and rotation about an axis parallel to the Z-axis.

The imprint material is a curable composition that is hardened by hardening energy. The imprint material is either in a hardened state or an unhardened state. Examples of the hardening energy include an electromagnetic wave and heat. Examples of the electromagnetic wave include light of a wavelength selected from 10 nanometers (nm) or more and 1 millimeter (mm) or less (for example, infrared rays, visible light, and ultraviolet rays).

A typical example of the curable composition is a composition hardened when irradiated with light or heated. A photocurable composition hardened by light can contain at least a polymerrizable compound and a photopolymerization initiator. A photocurable composition can additionally contain a nonpolymerizable compound or a solvent. An example of the nonpolymerizable compound can be at least one kind selected from a sensitizer, a hydrogen donator, an internal mold releasing agent, a surface-activating agent, an antioxidant, and polymers.

The imprint apparatus NIL can include a substrate holding unit 11, a substrate driving unit 12, a mold holding unit 3, a mold driving unit 13, a dispenser (a supplying unit) 15, a plurality of alignment scopes 6, the hardening unit 7, a shape correcting unit 30, and a control unit 20. The substrate holding unit 11 holds the substrate 1. The substrate driving unit 12 drives the substrate holding unit 11 to drive the substrate 1 about a plurality of axes (for example, the three axes of the X-axis, Y-axis, and θZ-axis). The mold holding unit 3 holds the mold 2. The mold driving unit 13 drives the mold holding unit 3 to drive the mold 2 about a plurality of axes (for example, the six axes of the X-axis, Y-axis, Z-axis, θx-axis, θY-axis, and θZ-axis). Driving of the mold 2 about the Z-axis with the mold driving unit 13 includes driving for bringing an imprint material on the substrate 1 into contact with the patterned portion P of the mold 2 and driving for separating (releasing) the patterned portion P of the mold 2 from a hardened imprint material on the substrate 1. The dispenser 15 is a supply unit for supplying an imprint material onto the substrate 1.

Each of the plurality of alignment scopes 6 outputs information indicating the relative position of a first mark 5 selected from a plurality of first marks 5 in a shot area (shot region) of the substrate 1 and a second mark 4 selected from a plurality of second marks 4 on the mold 2. The shot area refers to a region of the substrate 1 in which a pattern is formed at one time by contact of the mold 2 with the imprint material and hardening of the imprint material. Examples of the information indicating the relative position include image data on the first mark 5 and the second mark 4 and image data on an optical image formed from the first mark 5 and the second mark 4. For example, each alignment scope 6 can output information indicating the relative position of one first mark 5 and one second mark 4. At least part of the alignment scopes 6 can be disposed in an opening provided in the mold holding unit 3, as schematically illustrated in FIG. 1A. Alternatively, the alignment scopes 6 can be disposed away from the mold holding unit 3, as schematically illustrated in FIG. 1B. In the example schematically illustrated in FIG. 1B, an optical system 8 can be disposed between the mold 2 and the plurality of alignment scopes 6. An example of the optical system 8 can be an imaging optical system and/or a relay optical system.

The hardening unit 7 (irradiation unit) supplies energy for hardening the imprint material to the imprint material, with the patterned portion P of the mold 2 brought into contact with the imprint material supplied by the dispenser 15 onto the shot area of the substrate 1 with the mold driving unit 13. In this example, the energy is light, such as ultraviolet rays. In the example schematically illustrated in FIG. 1A, the hardening unit 7 is disposed above the opening of the mold holding unit 3. In the schematic example in FIG. 1B, the hardening unit 7 is disposed to irradiate the imprint material below the mold 2 via a mirror 18 disposed above the opening of the mold holding unit 3.

The shape correcting unit 30 corrects the shape of the patterned portion. P of the mold 2. For example, the shape correcting unit 30 deforms the mold 2 by applying force to the side of the mold 2, thereby correcting the shape of the patterned portion P. The control unit 20 can be configured to control the substrate holding unit 11, the substrate driving unit 12, the mold holding unit 3, the mold driving unit 13, the dispenser (the supply unit) 15, the plurality of alignment scopes 6, the hardening unit 7, and the shape correcting unit 30. The control unit 20 also controls aligning (for example, position and rotation, or position, rotation, and shape) of the shot area of the substrate 1 and the mold 2 on the basis of information excluding incorrect information of a plurality of pieces of information output from the plurality of alignment scopes 6. Examples of the control unit 20 include a programmable logic device (PLD), such as a field programmable gate array (FPGA), an application specific integrated circuit (ASIC), a general-purpose computer incorporating programs, and a combination of part or all of them.

Figure 2:
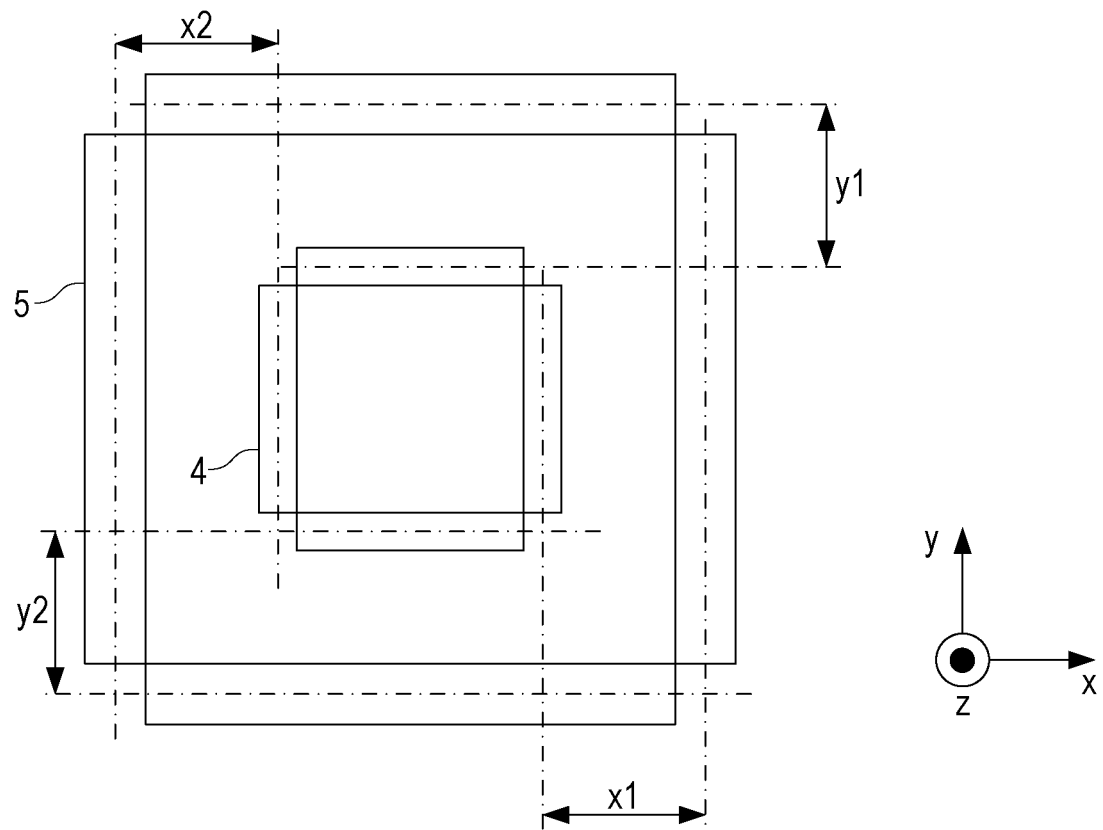
FIG. 2 is a diagram illustrating a mark pair consisting of a mark (a first mark) in a shot area of and a mark (a second mark) on a mold.

FIG. 2 illustrates the first mark 5 in the shot area of the substrate 1 and the second mark 4 on the mold 2 as an example. The expression of the first mark and the second mark is used to distinguish a mark in the shot area and a mark on the mold 2 from each other. The first mark 5 for the shot area may be disposed either in a scribe line or in a chip area. In this example, the first mark 5 and the second mark 4 constitute "box in box". In the example shown in FIG. 2, the first mark 5 is disposed outside the second mark 4, whereas the first mark 5 may be disposed inside the second mark 4. The control unit 20 calculates parameters indicating the relative position of the first mark 5 and the second mark 4 (for example, x1, x2, y1, and y2 in FIG. 2) based on information (for example, image data) output from the alignment scopes 6.

Figure 3A:
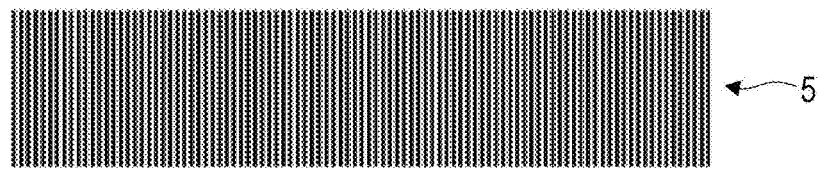
FIG. 3A is a diagram illustrating the line/space pattern of an example of the mark (the first mark) in the shot area.
Figure 3B:
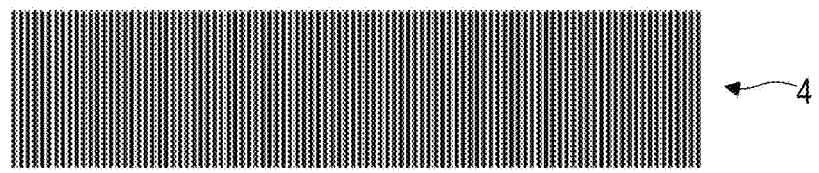
FIG. 3B is a diagram illustrating the line/space pattern of an example of the mark (the second mark) on the mold.
Figure 3C:
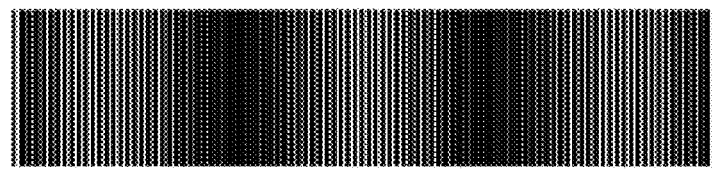
FIG. 3C is a diagram illustrating moire acquired by aligning the first mark and the second mark.
Figure 3D:
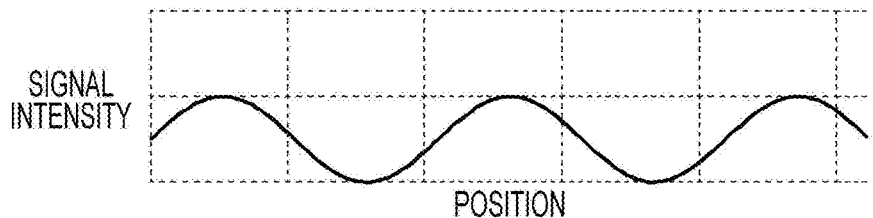
FIG. 3D is a diagram illustrating a moire signal.

FIGS. 3A and 3B respectively illustrate an example of the first mark 5 in the shot area of the substrate 1 and an example of the second mark 4 on the mold 2. The first mark 5 and the second mark 4 are formed in a line/space pattern. The first mark 5 and the second mark 4 are grating patterns whose line-space patterns have different pitches. By aligning the patterns, moire as illustrated in FIG. 3C is formed. The moire contains information indicating the relative position of the first mark 5 and the second mark 4. Each alignment scope 6 can acquire arm image of the moire and output image data acquired by image acquisition as information indicating the relative position of the first mark 5 and the second mark 4. The control unit 20 can acquire a moire signal, as illustrated in FIG. 3D, by processing the image data. In FIG. 3D, the horizontal axis indicates position, and the vertical axis indicates signal intensity. The signal intensity can be a value obtained by averaging or adding up the signal values of pixels at the same position of the image data.

In the examples in FIGS. 3A and 3B, the pitches of the line/space patterns of the first mark 5 and the second mark 4 are differentiated to generate moire. In another example, the first mark 5 and the second mark 4 may have line/space patterns with the same pitch. In the other example, no moire is formed from the first mark 5 and the second mark 4, and the relative position of the first mark 5 and the second mark 4 can be detected using the intensity of light that passed through the first mark 5 and the second mark 4.

Figure 4A:
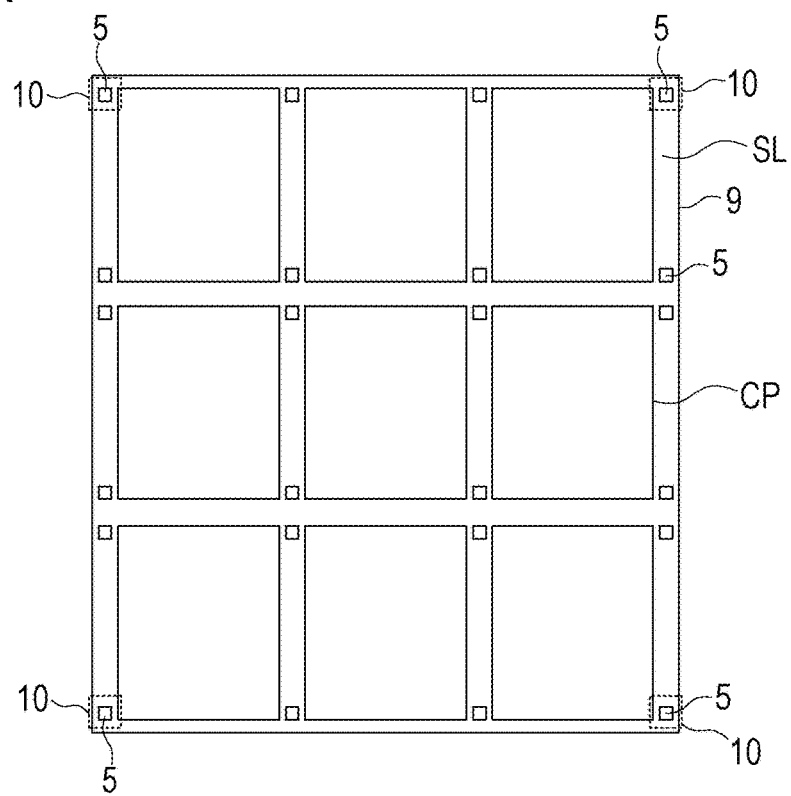
FIG. 4A is a diagram illustrating an example of the layout of a shot area.
Figure 4B:
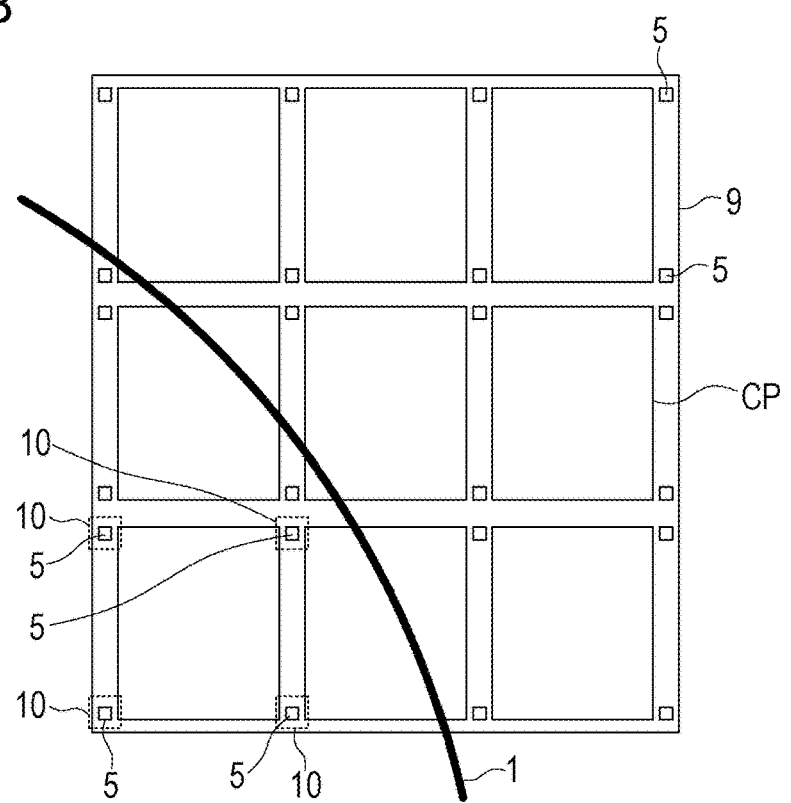
FIG. 4B is a diagram illustrating another example of the layout of the shot area.

FIGS. 4A and 4B illustrate the layout of one shot area 9 of the substrate 1 by way of example. The shot area 9 includes one or a plurality of chip areas CP. The shot area 9 also includes a plurality of first marks 5. The plurality of first marks 5 may be disposed either in a scribe line SL or in each chip area CP. Each chip area CP is an area to be cut out as an article, such as a semiconductor device. The scribe line SL is an area for cutting out the chip area CP.

FIG. 4A illustrates an example in which the whole of the shot area 9 is within an effective area (an area in which a pattern can be formed) of the substrate 1. FIG. 4B illustrates an example in which only part of the shot area 9 is within the effective area of the substrate 1. In the examples shown in FIGS. 4A and 4B, the imprint apparatus NIL includes four alignment scopes 6, and observation fields 10 of the individual alignment scopes 6 are indicated by dotted lines. The number of alignment scopes 6 can be determined according to alignment accuracy and throughput required. In the example shown in FIG. 4A, the first marks 5 and the corresponding second marks 4 on the mold 2 are observed for the individual corners of the shot area. 9 using the plurality of alignment scopes 6, and information indicating the relative position is output from the alignment scopes 6. In the example shown in FIG. 4B, the first marks 5 at the four corners of the chip areas CP disposed in the effective area of the substrate 1 and the corresponding second marks 4 are observed by the plurality of alignment scopes 6, and information indicating the relative position is output from the alignment scopes 6. The control unit 20 controls aligning of the shot area 9 of the substrate 1 and the mold 2 based on the information.

The control on the aligning of the shot area 9 of the substrate 1 and the mold 2 based on the relative position of the first marks 5 in the shot area 9 of the substrate 1 and the second marks 4 on the mold 2 is called die-by-die alignment. The accuracy of aligning the shot area 9 of the substrate 1 and the mold 2 (the accuracy of die-by-die alignment) is influenced by the accuracy of measurement of the relative position of the first marks 5 in the shot area 9 and the second marks 4 on the mold 2. Since the substrate 1 undergoes various processes before imprinting, the first marks 5 in the shot area 9 are also influenced by the processes. For example, causes of error, such as distortion and unevenness in thickness around the first marks 5 and asymmetry of the first marks due to etching or chemical-mechanical polishing (CMP), exert an influence on the measurement accuracy. A measurement error due to such causes of error is referred to as wafer induced shift (WIS). The plurality of alignment scopes 6 has variations in accuracy. A measurement error due to such a cause of error is referred to as tool induced shift (TIS). Interaction between TIS and WIS can cause a nonlinear error. Furthermore, a gap between the shape of the first marks 5 and the original shape, adhesion of foreign particles to the first marks 5 and/or the second marks 4, or noise light coming from a pattern around the first marks 5 can cause a measurement error. In particular, in a die-by-die alignment method using a plurality of alignment scopes 6, incorrect information due to error causes contained in information output from part of alignment scopes 6 can decrease the accuracy of measurement of the relative positional relationship between the shot area 9 and the mold 2.

For that reason, the control unit 20 controls aligning of the shot area 9 of the substrate 1 and the mold 2 based on information excluding incorrect information from a plurality of pieces of information output from the plurality of alignment scopes 6. This can ensure sufficient accuracy of alignment of the shot area 9 and the mold 2. For example, when one piece of information is incorrect information in a setting in which aligning is controlled based on four pieces of information acquired by observing mark pairs at the four corners of the shot area 9 and the mold 2, aligning can be controlled based on the remaining three pieces of information. Examples of control of aligning of the shot area 9 of the substrate 1 and the mold 2 can include, decreasing the relative position (displacement), relative rotation, and a difference in shape between the shot area 9 and the mold 2. The decrease in the relative position and rotation can be controlled by at least one of the substrate driving unit 12 and the mold driving unit 13. The decrease in difference in shape can be controlled by the shape correcting unit 30.

The control unit 20 can identify incorrect information by, for example, comparing a plurality of pieces of information output from the plurality of alignment scopes 6. The TIS caused by a difference in aberration among the plurality of alignment scopes 6 can be decreased by calibration. Therefore, there may be almost no difference among a plurality of pieces of information (for example, image data) output from the plurality of alignment scopes 6. For that reason, information having significant difference from the other information can be regarded as incorrect information. Whether there is significant difference is determined according to whether the amount of difference among the information exceeds a predetermined reference value.

The plurality of pieces of information output from the plurality of alignment scopes 6 may be directly compared with one another. However, comparing a plurality of signals acquired by individually processing the plurality of pieces of information allows incorrect information to be identified with high accuracy. For example, the control unit 20 can acquire a moire signal, as shown in FIG. 3D, by processing information output from each alignment scope 6 and can identify incorrect information based on the acquired moire signal. The control unit 20 can identify incorrect information based on an indicator (for example, at least one of the contrast, distortion, and intensity of the signal) acquired by processing information output from each alignment scope 6.

Figure 3E:
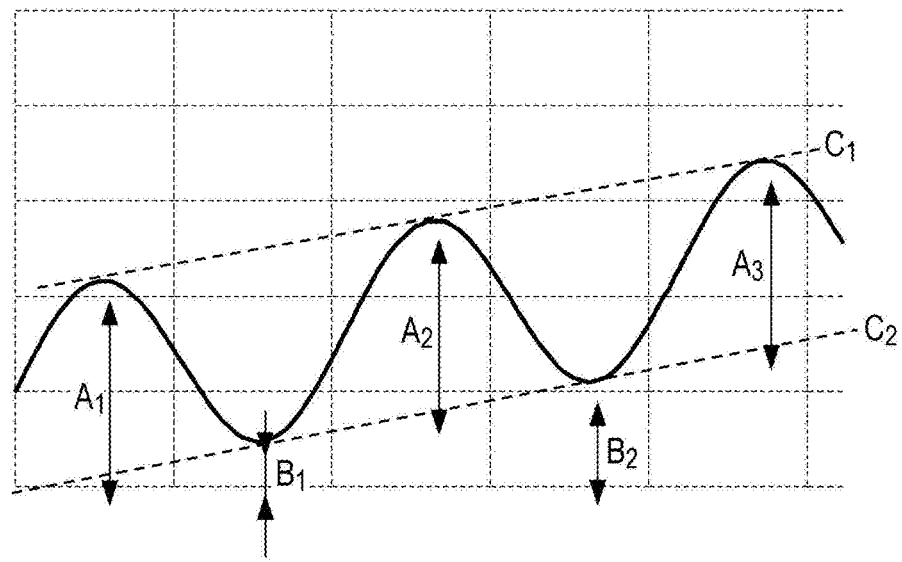
FIG. 3E is a diagram illustrating an example of an indicator calculated based on the moire in FIG. 3C.

FIG. 3E illustrates an example of the indicator calculated based on moire (image data), as illustrated in FIG. 3C, where Ax (x is a subscript, the same applies hereafter) is a peak value at a position where the moire signal is at its peak, Bx is a bottom value at a position where the moire signal is at its bottom. Bx should be zero but can be a value other than zero because of electrical noise or noise light coming from the periphery of the shot area, as illustrated in FIGS. 3D and 3E. Contrast can be due to, for example, the difference between Ax and Bx. The larger the contrast, the higher the reliability of the information (that is, less error cause). Sign Cx denotes the inclination of the entire mark. Cx can be the inclination of a straight line connecting a plurality of Ax and the inclination of a straight line connecting a plurality of Bx.

The inclination is close to zero when there is no error cause. A line connecting the plurality of Ax (or Bx) can be a curve when the line is locally inclined. In this case, the curve can be obtained by polynomial approximation, for example.

Without an error cause, the moire signal illustrated in FIG. 3D can be a bilaterally symmetric trigonometrical wave, but with an error cause, the signal can have distortion. In this case, the correctness of the signal can be estimated by determining the bilaterally symmetry with reference to the peak position, bottom position, and the center of gravity of the signal. The control unit 20 can identify an abnormal signal among a plurality of signals output from the plurality of alignment scopes 6 by comparing indicators acquired by processing the plurality of signals. For example, if a contrast acquired by processing some information is lower by greater than a reference value than a contrast acquired by processing another information, the control unit 20 can identify the information as incorrect information.

Alternatively, moire signals, as illustrated in FIG. 3D, acquired from information output from the alignment scopes 6 may be decomposed into various components by Fourier transform or the like, and the signal intensities or the shapes of the components may be compared to one another. Fourier transform includes fast Fourier transform and discrete Fourier transform. For example, for moire signals, a frequency for use in measurement is determined by the design values of the marks, and the others are noise components. For that reason, the intensities of frequency components for use in measurement are compared with one another. Moire signals whose intensities are significantly lower than those of the others have many noise components can be determined to be signals containing many errors, although they have apparent signal values but many noise components. In contrast, the intensities of noise components may be compared, and moire signals having high-intensity noise components can be determined to contain many errors.

Figure 7A:
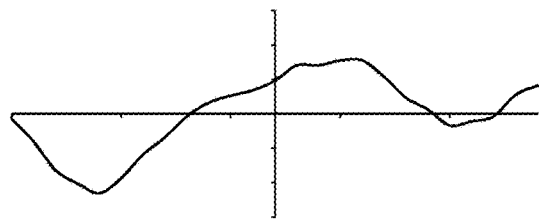
FIG. 7A is a diagram illustrating an example of a moire signal.
Figure 7B:
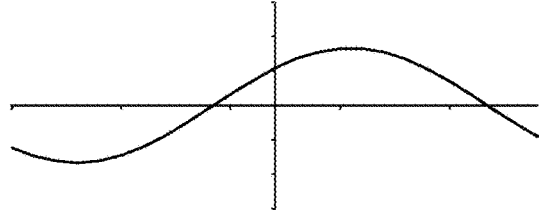
FIG. 7B is a diagram illustrating a primary component derived from the moire signal by Fourier transform.
Figure 7C:
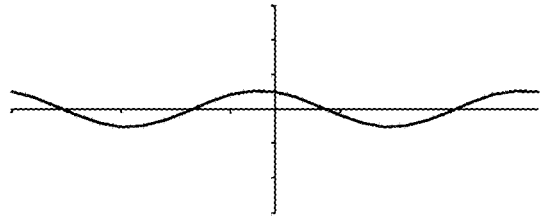
FIG. 7C is a diagram illustrating a secondary component of the moire signal.
Figure 7D:
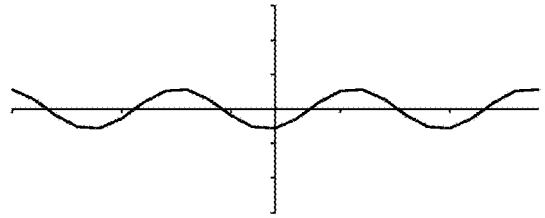
FIG. 7D is a diagram illustrating a tertiary component of the moire signal.
Figure 7E:
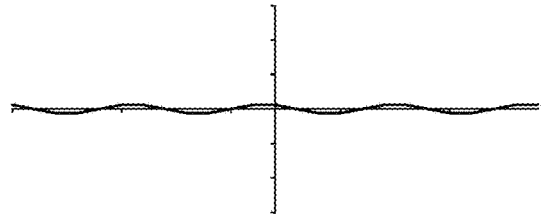
FIG. 7E is a diagram illustrating a quaternary component of the moire signal.
Figure 7F:
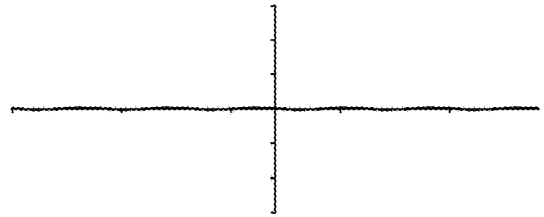
FIG. 7F is a diagram illustrating a quintic component of the moire signal.

FIG. 7A illustrates a moire signal as an example. FIGS. 7B to 7F illustrate signals in which the moire signal in FIG. 7A is decomposed into frequency components by Fourier transform. FIG. 7B illustrates a signal (a primary component corresponding to a cycle derived from the design pitch of the marks (the first mark 5 and the second mark 4), FIG. 7C illustrates a secondary component, FIG. 7D illustrates a tertiary component, FIG. 7E illustrates a quaternary component, and FIG. 7F illustrates a quintic component. This shows that the moire signal illustrated in FIG. 7A is not a trigonometric function (sign wave) but contains noise components. Fourier transform is used to separate the moire signal into the original signal and noise components. The primary component illustrated in FIG. 7B corresponds to a moire signal to be used in measurement. A signal in which this component is dominant (with high contrast) is a signal having a high signal to noise (S/N) ratio. It is normally desirable that the secondary component and the subsequent components are as low as possible (as low contrast as possible) because they are noise. The S/N ratios of signals from the alignment scopes 6 can be determined by comparing them.

For high-accuracy alignment of the shot area of the substrate 1 and the mold 2, there is a method of alignment in which the shot area of the substrate 1 and the mold 2 are roughly aligned (with low accuracy) using rough-inspection marks and are then accurately aligned using close-inspection marks (fine marks). In alignment using rough-inspection marks, the relative position of the shot area and the mold 2 is detected with low accuracy using rough-inspection marks (referred to as rough inspection), and the shot area and the mold 2 are aligned with low accuracy based on the result. In alignment using close-inspection marks, the relative position of the shot area and the mold 2 is detected with high accuracy using close-inspection marks (referred to as close inspection), and the shot area and the mold 2 are aligned with high accuracy based on the result. Although they differ in accuracy, both the rough inspection and the close inspection give substantially the same measurement results because they are measurement for detecting the relative position of the shot area and the mold. However, if either of the measurement results is incorrect, the measurement results can have determinable difference.

Figure 8:
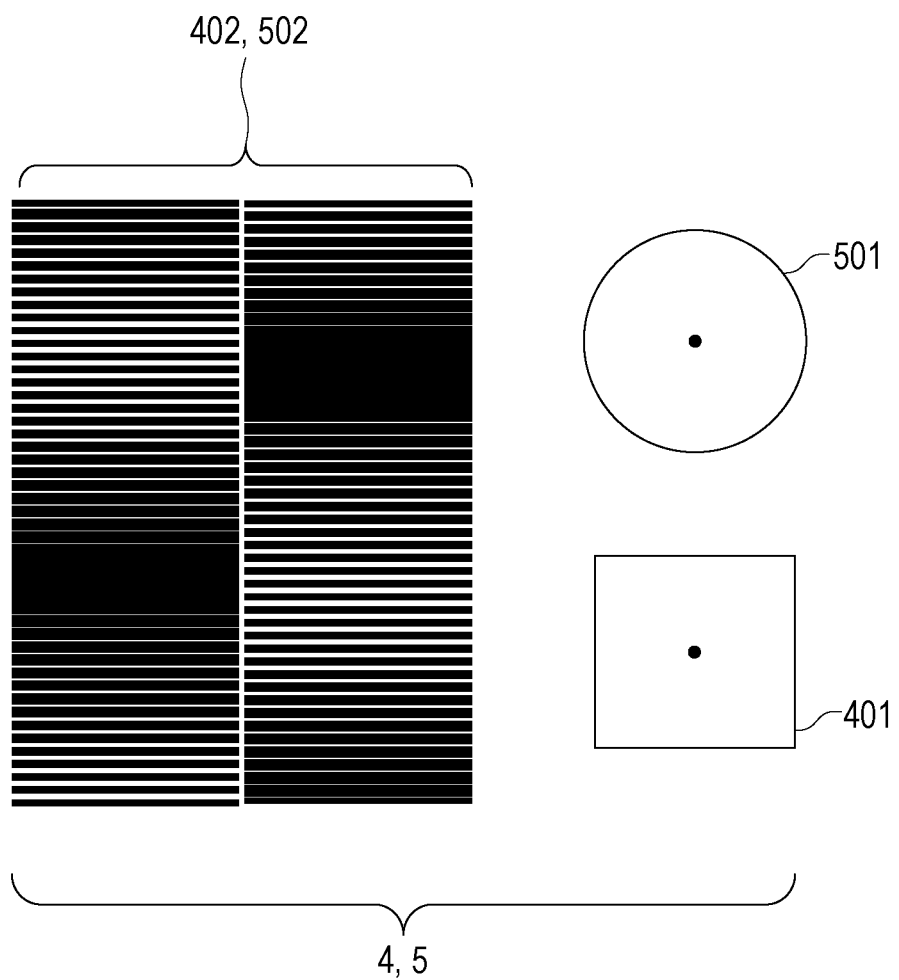
FIG. 8 is a diagram illustrating a pair of rough-inspection marks and a pair of close-inspection marks.

FIG. 8 illustrate one of the first marks 5 in one of a plurality of shot areas of the substrate 1 and one of the plurality of second marks 4 on the mold 2 overlaid. The first mark 5 includes a first rough-inspection mark 501 and a first close-inspection mark 502. The second mark 4 includes a second rough-inspection mark 401 and a second close-inspection mark 402. In this example, the first close-inspection mark 502 and the second close-inspection mark 402 are grating patterns that form moire. FIG. 8 illustrates moire formed by the first close-inspection mark 502 and the second close-inspection mark 402 instead of the first close-inspection mark 502 and the second close-inspection mark 402 for illustrative purpose.

Information output from each alignment scope 6 is information indicating the relative position of the first mark 5 and the second mark 4, as described above. This information can contain first information indicating the relative position of the first rough-inspection mark 501 and the second rough-inspection mark 401 and second information indicating the relative position of the first close-inspection mark 502 and the second close-inspection mark 402. The control unit 20 can identify incorrect information based on the difference between a first relative position of the shot area and the mold 2 acquired from the first information and a second relative position of the shot area and the mold 2 acquired from the second information. Such a method can be applied to rough inspection (second rough inspection) and close inspection after alignment of the shot area and the mold 2 is performed based on the result of rough inspection. In other words, incorrect information can be identified based on the difference between the first relative position, acquired based on the first information at the second rough inspection, and the second relative position, acquired from the second information in close inspection. In this example, in the first rough inspection, the relative position of the shot area and the mold 2 may be acquired based on information excluding incorrect information of the plurality of pieces of information output from the plurality of alignment scopes 6. Incorrect information can be identified by, for example, comparing the plurality of pieces of information output from the plurality of alignment scopes 6 with one another.

Alternatively, incorrect information can be identified by the following method. For example, the control unit 20 can acquire detection results indicating the relative position of the first marks 5 and the second marks 4 observed using the alignment scopes 6 based on information output from the alignment scopes 6. Thus, the control unit 20 can acquire a plurality of detection results based on a plurality of pieces of information output from the plurality of alignment scopes 6. The control unit 20 can determine information that causes a detection result that differs from the average of the plurality of detection results by a value greater than predetermined reference to be incorrect information.

Alternatively, incorrect information can be identified as follows. For example, a reference image or signal shape is acquired in advance. Difference from the reference is converted to numerical values as indicators based on the degree of correlation to the reference, and the reference and the indicators are compared. The reference image or signal shape can be acquired in advance by measuring marks on a substrate to be actually used or by simulation. Alternatively, marks for generating ideal signals equivalent to signals to be actually used may be used, such as reference marks formed on a substrate holding unit or a reference substrate or marks for emitting false light signals of a trigonometrical wave at the same cycle as that of moire. Comparing these ideal signals with signals based on information output from the alignment scopes 6 during actual imprinting allows determination whether the information is incorrect information. At that time, identification of incorrect information may be based on an indicator, such as the contrast of the signal, or using Fourier transform, as described above.

Referring to FIG. 5, an operation for imprinting based on information excluding incorrect information from a plurality of pieces of information output from the plurality of alignment scopes 6 will be described. This operation is controlled by the control unit 20. First, at step S501, an imprint material is supplied to an imprinting-target shot area (hereinafter referred to as a target shot area) of a plurality of shot areas of the substrate 1 using the dispenser 15. At step S502, the target shot area is driven to a position below the mold 2 by the substrate driving unit 12. At step S503, the mold driving unit 13 starts an operation for lowering the mold 2 to bring the patterned portion P of the mold 2 into contact with the imprint material in the target shot area. At step S504, a plurality of mark pairs are observed using the plurality of alignment scopes 6. Each mark pair can be composed of one of the plurality of first marks 5 in the target shot area and one of the plurality of second marks 4 on the mold 2. The plurality of alignment scopes 6 each output information on corresponding one of the mark pairs. At step S505, the control unit 20 removes incorrect information from a plurality of pieces of information output from the plurality of alignment scopes 6. At step S506, the control unit 20 generates control information for aligning the target shot area and the mold 2 based on information, excluding incorrect information, from the plurality of pieces of information output from the plurality of alignment scopes 6. An example of the control information is information for controlling the substrate driving unit 12, the mold driving unit 13, and the shape correcting unit 30 to align the target shot area and the mold 2. At step S507, the control unit 20 controls the substrate driving unit 12, the mold driving unit 13, and the shape correcting unit 30 based on the control information so that the mold 2 is aligned on the target shot area.

At step S508, the control unit 20 determines whether the control for aligning the mold 2 on the target shot area has been completed and whether the lowering of the mold 2 for bringing the patterned portion P of the mold 2 into contact with the imprint material on the target shot area has been completed. If it is determined that the control for aligning the mold 2 on the target shot area has been completed and that the lowering of the mold 2 has been completed (YES at step S508), the control unit 20 moves the process to step S509; otherwise, the control unit 20 moves the process to step S504 (NO at step S508). The control for aligning the mold 2 on the target shot area can include correction of the position and rotation of the mold 2 relative to the target shot area with the substrate driving unit 12 and the mold driving unit 13 and correction of the shape of the mold 2 with the shape correcting unit 30.

At step S509, the hardening unit 7 supplies energy to the imprint material below the mold 2, so that the imprint material is hardened. At step S510, the mold driving unit 13 drives the mold 2 so that the patterned portion P of the mold 2 is separated from the hardened imprint material on the target shot area. At step S511, the control unit 20 determines whether the next shot area to be subjected to imprinting is present. If the next shot area is present (YES at step S511), the process at step S501 and the subsequent processes are executed for the next shot area. If imprinting for all shot areas has been completed (NO at step S511), the operation shown in FIG. 5 ends.

In the example shown in FIG. 5, observation with the plurality of alignment scopes 6 is performed after the lowering of the mold 2 is started. The observation with the plurality of alignment scopes 6 may be performed before the lowering of the mold 2 is started. The fact that incorrect information is removed at step S505 may be output to a display or the like (not shown).

Additional description will be given to the process at step S506. As described above, at step S506, the control unit 20 generates control information for controlling aligning of the shot area and the mold 2 based on information, excluding incorrect information, from a plurality of pieces of information output from the plurality of alignment scopes 6. Merely excluding incorrect information can decrease the accuracy of aligning the mold 2 on the target shot area. For that reason, information acquired for another mark pair by the alignment scopes 6 can be used instead of the incorrect information. As illustrated in FIGS. 4A and 4B, the shot area 9 can contain first marks 5 in addition to the first mark 5 observed at step S504. Therefore, a mark pair composed of a first mark 5 other than the first mark 5 observed at step S504 and a corresponding second mark 4 on the mold 2 can be observed with an alignment scope 6 selected from the plurality of alignment scopes 6. This allows the control unit 20 to use information on the mark pair output from the alignment scope 6 as additional information instead of the above-described incorrect information.

The mark pair to be newly observed to acquire additional information can be set in advance. Examples of the mark pair to be newly observed to acquire additional information include a mark pair close to a mark pair relating to incorrect information so that the time taken to drive the alignment scope 6 is reduced in the viewpoint of preventing a decrease in throughput, a mark pair present at an advantageous position in the viewpoint of alignment accuracy, and a mark pair selected based on the position of a mark pair used in alignment inspection after imprinting.

Observation of the new mark pair for acquiring additional information can need to move the alignment scope 6 to observe the mark pair. Therefore, the control unit 20 can re-observe a mark pair(s) one or a plurality of times using an alignment scope(s) 6 that output(s) information other than the incorrect information identified at step S505. The control unit 20 can control aligning of the shot area and the mold 2 using information acquired by the re-observation in addition to the information acquired at step S504. This method improves the measurement accuracy using an averaging effect. It is known that measurement accuracy depends on the square root of the number of times of measurement, e.g., $\sqrt{}$(the number of times of measurement), because of the averaging effect. For example, increasing the number of times of measurement from one to four doubles the measurement accuracy, and increasing the number to nine triples the measurement accuracy.

If incorrect information is generated, the control unit 20 can control aligning of the target shot area and the mold 2 based on information excluding the incorrect information and also information that is previously acquired using the plurality of alignment scopes 6 for a substrate different from the substrate at which the incorrect information is generated. In general, there is high probability that substrates undergoing the same process (in particular, substrates of the same lot) have the same shape. For that reason, the incorrect information can be compensated with previous information acquired using the plurality of alignment scopes 6 for a substrate different from the substrate at which the incorrect information is generated. The previous information can be information acquired using the plurality of alignment scopes 6 for a shot area at the same position in design as that of the shot area in which the incorrect information is generated among a plurality of shot areas of a substrate different from the substrate at which the incorrect information is generated.

If incorrect information is generated, the control unit 20 can control aligning of the target shot area and the mold 2 based on information excluding the incorrect information and also information (a shape of the shot area) that is previously acquired using the plurality of alignment scopes 6 for another shot area of the substrate at which the incorrect information is generated. The control will be described with reference to FIG. 9. A shot area 9-1 is an imprinted shot area. A shot area 9-2 is an unimprinted shot area. In imprinting on the shot area 9-1, no incorrect information is generated for the first marks 5-11, 5-12, 5-13, and 5-14. In imprinting on the target shot area 9-2, information output from an alignment scope 6 that observes a first mark 5-24 and a corresponding second mark 4, among the plurality of alignment scopes 6, is incorrect information. In this case, the control unit 20 can control aligning of the target shot area 9-2 and the mold 2 based on previous information on a shot area different from the target shot area 9-2, acquired using the plurality of alignment scopes 6. An example of the shot area different from the target shot area 9-2 can be the shot area 9-1 next to the target shot area 9-2.

In the above embodiments, incorrect information is removed from information on mark pairs selected for alignment control using the plurality of alignment scopes 6. However, the present disclosure is not limited to the above. For example, suppose that information on n mark pairs is used for alignment control. In this case, the alignment can be controlled using n pieces of information excluding incorrect information from m pieces of information acquired by observing m mark pairs (m>n) using a plurality of alignment scopes 6.

A modification of the above embodiments will be described hereinbelow. It is to be understood that components and matters that are not referred to in the modification conform to the above embodiments. First, the principle of the modification will be described. A change in relative positional relationship between the target shot area and the mold 2 (including relative position and relative rotation) will change the relative position of the first mark 5 and the second mark 4 by an amount corresponding thereto. Presence of data different from the other data in a data set on the amount of change of a plurality of relative positions acquired from a plurality of pieces of information output from the plurality of alignment scopes 6 shows that the plurality of pieces of information contain incorrect information. For example, if data on the amount of change in relative position of one mark pair differs from data on the amount of change in the relative position of the other plurality of mark pairs, it can be determined that information on the one mark pair output from the alignment scope 6 is incorrect information.

The operation of the modification will be described with reference to FIG. 6. This operation is controlled by the control unit 20. Steps S501 to S503 are the same as those in FIG. 5. At step S601, the control unit 20 observes a plurality of mark pairs with a plurality of alignment scopes 6, in a state in which the relative position of the target shot area and the mold 2 is a first relative position to acquire a plurality of pieces of information (hereinafter referred to as "before-change information") output from the plurality of alignment scopes 6. At step S602, the control unit 20 controls the substrate driving unit 12 and/or the mold driving unit 13 so that the relative position of the target shot area and the mold 2 is changed to a second relative position. At step S603, the control unit 20 observes a plurality of mark pairs with a plurality of alignment scopes 6, in a state in which the relative position of the target shot area and the mold 2 is a second relative position to acquire a plurality of pieces of information (hereinafter referred to as "after-change information") output from the plurality of alignment scopes.

At step S604, the control unit 20 identifies incorrect information based on the difference between the relative position of the individual mark pairs, acquired based on the individual before-change information, and the relative position of the individual mark pairs, acquired based on the individual after-change information. The relative position of the mark pair refers to the relative position of the first mark 5 and the second mark 4 constituting the mark pair. For example, when the difference between the first relative position and the second relative position is $\Delta X$, the difference between the relative position of individual mark pairs acquired based on the individual before-change information and the relative position of the individual mark pairs acquired based on the after-change information would be $\Delta X$. For that reason, the control unit 20 determines that information output from an alignment scope 6 that observes a mark pair, in which the difference is incorrect, is incorrect information and removes the incorrect information. Instead of using the change in relative position acquired using the alignment scope 6 to identify incorrect information, a change in relative position acquired using the substrate driving unit 12 may be used to identify incorrect information. The process at step S506 and subsequent processes are the same as those in FIG. 5. In the case where the difference between the first relative position and the second relative position contains a rotational component, the difference between the relative position of each mark pair acquired based on the before-change information and the relative position of each mark pair acquired based on the after-change information depends on the rotational component.

A method for producing a device, or an article (for example, a semiconductor integrated circuit element and a liquid-crystal display element) includes a process for forming a pattern on a substrate (for example, a wafer, a glass plate, and a film substrate) using the above imprint apparatus. The production method can further include a process for processing (for example, etching) the substrate on which the pattern is formed. For other articles, such as patterned media (recording media) and optical devices, the production method can include, instead of etching, another process for processing the substrate on which the pattern is formed. The method for producing an article according to the embodiments has an advantage in at least one of the performance, quality, productivity, and production cost of the product over conventional methods.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-233756, filed Nov. 30, 2015, which is hereby incorporated by reference herein in its entirety.

What is claimed is:

1. A method for an imprint apparatus having plurality of alignment scopes and for forming a pattern of an imprint material on a substrate using a mold wherein the imprint the method comprising:
controlling, via a control unit, alignment of a shot region of the substrate and the mold,
wherein the shot region includes a plurality of first marks and the mold includes a plurality of second marks,
wherein the plurality of first marks corresponds respectively to the plurality of second marks,
wherein alignment information includes relative position information and incorrect information,
wherein the relative position information includes information about at least one of relative rotation position and relative shift position of each mark pair, and the incorrect information includes information, induced by the substrate or induced by the mold into information about at least one mark pair, that is incorrect,
wherein, in a case where the relative position information is input into each of the plurality of alignment scopes, the incorrect information is input into at least one of the plurality of alignment scopes, and the plurality of alignment scopes outputs information based on the input relative position information and the input incorrect information, controlling includes identifying the incorrect information based on the information output from the plurality of alignment scopes, and
wherein controlling includes excluding the identified incorrect information from the alignment information and controlling alignment of the shot region and the mold based on the relative position information in the alignment information from which the identified incorrect information has been excluded.

2. An imprint apparatus for forming a pattern of an imprint material on a substrate using a mold, the imprint apparatus comprising:
a plurality of alignment scopes; and
a control unit configured to control aligning a shot region of the substrate and the mold,
wherein the shot region includes a plurality of first marks and the mold includes a plurality of second marks,
wherein each of the plurality of first marks forms a mark pair with the plurality of second marks,
wherein aligning information includes relative position information and incorrect information,
wherein the relative position information includes information about at least one of relative rotation position and relative shift position of each of the mark pairs, and the incorrect information includes information, induced by the substrate or induced by the mold into information about at least one mark pair, that is incorrect,
wherein, in a case where the relative position information is input into each of the plurality of alignment scopes, the incorrect information is input into at least one of the plurality of alignment scopes, and the plurality of alignment scopes outputs information based on the input relative position information and the input incorrect information, the control unit identifies the incorrect information based on the information output from the plurality of alignment scopes, and
wherein the control unit excludes the identified incorrect information from the aligning information and controls aligning of the shot region and the mold based on the relative position information in the aligning information.

3. The imprint apparatus according to claim 2, wherein the control unit identifies the incorrect information based on at least one of contrast, distortion, and intensity of signals acquired by processing information input into the plurality of alignment scopes.

4. The imprint apparatus according to claim 2,
wherein each of the plurality of first marks includes a first rough-inspection mark and a first close-inspection mark,
wherein each of the plurality of second marks includes a second rough-inspection mark and a second close-inspection mark,
wherein information output from an alignment scope of the plurality of alignment scopes includes first information indicating a relative position of the first rough-inspection mark and the second rough-inspection mark and second information indicating a relative position of the first close-inspection mark and the second close-inspection mark, and
wherein the control unit identifies the incorrect information based on a difference between a first relative position of the shot region and the mold, acquired based on the first information, and a second relative position of the shot region and the mold, acquired based on the second information.

5. The imprint apparatus according to claim 2, wherein the control unit acquires a plurality of detection results based on the information output from the plurality of alignment scopes by acquiring detection results indicating a relative position of the plurality of first marks and the plurality of second marks observed with the plurality of alignment scopes based on output information output from the plurality of alignment scopes, and identifies, as the incorrect information, information that causes a detection result that is different from an average of the plurality of detection results by a value greater than a predetermined reference.

6. The imprint apparatus according to claim 2,
wherein the plurality of first marks includes a first mark and the plurality of second marks includes a second mark, and
wherein the control unit identifies the incorrect information based on a difference between a relative position of the first mark and the second mark acquired based on output information output from each of the plurality of alignment scopes in a state in which a relative position of the shot region and the mold is a first relative position and a relative position of the first mark and the second mark acquired based on output information output from each of the plurality of alignment scopes in a state in which the relative position of the shot region and the mold is a second relative position.

7. The imprint apparatus according to claim 2,
wherein the plurality of first marks includes a first mark and the plurality of second marks includes a second mark, and
wherein, in a case where there is an incorrect information pair of the first mark and the second mark relating to the incorrect information and an alignment scope is selected from the plurality of alignment scopes, the control unit controls the selected alignment scope so that the selected alignment scope generates information by observing an observed first mark and an observed second mark constituting a particular pair different from the incorrect information pair, and controls alignment of the shot region and the mold using the generated information instead of the incorrect information.

8. The imprint apparatus according to claim 2,
wherein the plurality of first marks includes a first mark and the plurality of second marks includes a second mark, and
wherein the control unit controls, from the plurality of alignment scopes, an alignment scope that outputs information excluding the incorrect information so that the controlled alignment scope re-observes the first mark and the second mark that have already been observed and controls alignment of the shot region and the mold based on the information, excluding the incorrect information, output from the controlled alignment scope and information acquired by the re-observation.

9. The imprint apparatus according to claim 2,
wherein the substrate is a first substrate,
wherein, when the incorrect information is generated, the control unit controls alignment of the shot region and the mold based on the alignment information, excluding the incorrect information, and information previously acquired using the plurality of alignment scopes, and
wherein the previously acquired information is from a second substrate different from the first substrate.

10. The imprint apparatus according to claim 9, wherein the previously acquired information is information previously acquired using the plurality of alignment scopes for a shot region disposed in the same position in design as a shot region among a plurality of shot regions of the second substrate.

11. The imprint apparatus according to claim 2, wherein, when the incorrect information is generated, the control unit controls alignment of the shot region and the mold based on the alignment information, excluding the incorrect information, and information on another shot region of the substrate, where the information on the another shot region of the substrate is previously acquired using the plurality of alignment scopes.

12. The imprint apparatus according to claim 2, wherein the substrate is configured to induce the incorrect information from at least one of the following: distortion and unevenness in surface around a first mark of the plurality of first marks, asymmetry of the plurality of first marks, adhesion of a foreign particle to the first mark, and noise light coming from a pattern around the first mark.

13. The imprint apparatus according to claim 2, the imprint apparatus further comprising the imprint material, wherein the imprint material is a curable composition configured to be hardened by hardening energy.

14. The imprint apparatus according to claim 2,
wherein the control unit is configured to individually process each piece of information output from the plurality of alignment scopes to acquire a moire signal and identify the incorrect information based on the acquired moire signal, and
wherein, in a case where the moire signal is a bilaterally symmetric trigonometrical wave, the control unit determines that there is no incorrect information to cause error.

15. The imprint apparatus according to claim 14, wherein, in a case where the moire signal is separated into individual components by Fourier transform, including a primary component and a secondary component, and contrast of the secondary component is greater than a predetermined reference, the control unit identifies the secondary component as the incorrect information.

16. The imprint apparatus according to claim 2, the control unit further is configured to repeatedly identify the incorrect information while the control unit determines that control for alignment of the mold on a target shot area has not been completed and lowering of the mold has not been completed.

17. The imprint apparatus according to claim 2, wherein, after the control unit identifies and removes incorrect information concerning a target shot area from a plurality of pieces of output information concerning the target shot area and the mold is separated from hardened imprint material on the target shot area, the control unit, in a case where a next shot area to be subjected to imprinting is present, identifies incorrect information for the next shot area.

18. The imprint apparatus according to claim 2,
wherein, in a case where incorrect information is to be excluded from the alignment information, the control unit subsequently acquires information for a first mark pair that is utilized instead of the incorrect information in determining the alignment information to avoid decreasing accuracy of alignment of the shot region and the mold, and
wherein the first mark pair includes at least one mark that is different from a first mark from the plurality of first marks and a second mark from the plurality of second marks.

19. An imprint apparatus for forming a pattern of an imprint material on a substrate using a mold, the imprint apparatus comprising:
a plurality of alignment scopes; and
a control unit configured to control alignment of a shot region of the substrate and the mold,
wherein the shot region includes a plurality of first marks and the mold includes a plurality of second marks,
wherein the plurality of first marks corresponds respectively to the plurality of second marks,
wherein alignment information includes relative position information and incorrect information,
wherein the relative position information includes information about at least one of relative rotation position and relative shift position of each mark pair, and the incorrect information includes information, induced by the substrate or induced by the mold into information about at least one mark pair, that is incorrect,
wherein the control unit identifies incorrect information by comparing a plurality of pieces of alignment information respectively output from a plurality of alignment scopes with each other, and
wherein the control unit excludes the identified incorrect information from the plurality of pieces of alignment information and controls alignment of the shot region and the mold based on the alignment information from which the identified incorrect information has been excluded.

20. The imprint apparatus according to claim 19,
wherein the control unit compares the plurality of pieces of alignment information respectively output from the plurality of alignment scopes with each other, and
wherein, in a case where an amount of difference between each alignment information exceeds a predetermined reference value, the control unit identifies the alignment information exceeding the predetermined reference value as the incorrect information generated due to the substrate.

21. A method for an imprint apparatus having a plurality of alignment scopes and for forming a pattern of an imprint material on a substrate using a mold, the method comprising:
controlling, via a control unit, alignment of a shot region of the substrate and the mold,
wherein the shot region includes a plurality of first marks and the mold includes a plurality of second marks,
wherein the plurality of first marks corresponds respectively to the plurality of second marks,
wherein alignment information includes relative position information and incorrect information,
wherein the relative position information includes information about at least one of relative rotation position and relative shift position of each mark pair, and the incorrect information includes information, induced by the substrate or induced by the mold into information about at least one mark pair, that is incorrect,
wherein controlling includes identifying incorrect information by comparing a plurality of pieces of alignment information respectively output from a plurality of alignment scopes with each other, and
wherein controlling includes excluding the identified incorrect information from the plurality of pieces of alignment information and controlling alignment of the shot region and the mold based on the alignment information from which the identified incorrect information has been excluded.

* * * * *